United States Patent
Miyaharu

(10) Patent No.: US 8,013,976 B2
(45) Date of Patent: Sep. 6, 2011

(54) EXPOSURE APPARATUS, EXPOSURE METHOD, AND DEVICE FABRICATION METHOD

(75) Inventor: Takafumi Miyaharu, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 547 days.

(21) Appl. No.: 12/120,747

(22) Filed: May 15, 2008

(65) Prior Publication Data

US 2008/0291421 A1    Nov. 27, 2008

(30) Foreign Application Priority Data

May 21, 2007    (JP) .................. 2007-134584

(51) Int. Cl.
*G03B 27/68*    (2006.01)

(52) U.S. Cl. .................................................. 355/52

(58) Field of Classification Search ............ 355/53, 355/68, 52; 356/121; 702/1
See application file for complete search history.

(56) References Cited

U.S. PATENT DOCUMENTS

| 7,221,431 B2 | 5/2007 | Ohsaki | |
| 2002/0024643 A1* | 2/2002 | Nakauchi et al. | 355/52 |
| 2006/0170891 A1 | 8/2006 | Nishinaga et al. | |

FOREIGN PATENT DOCUMENTS

| JP | 2005-129914 A | 5/2005 |
| JP | 2005-175034 A | 6/2005 |
| JP | 2005-268744 A | 9/2005 |

* cited by examiner

*Primary Examiner* — Edward J Glick
*Assistant Examiner* — Deoram Persaud
(74) *Attorney, Agent, or Firm* — Canon U.S.A., Inc. IP Division

(57) ABSTRACT

The present invention provides an exposure apparatus which exposes a substrate via a liquid, comprising a measurement substrate including a transmission part configured to transmit a light beam having passed through a projection optical system, a light-receiving unit including a light-receiving surface configured to receive the light beam transmitted through the liquid and the transmission part, and a calculator configured to arithmetically convert a light intensity distribution, on the light-receiving surface, of the light beam received by the light-receiving surface into a light intensity distribution on a pupil plane of the projection optigottacal system, based on information indicating a correlation between a position coordinate on the light-receiving surface and a position coordinate on the pupil of the projection optical system.

9 Claims, 12 Drawing Sheets

EXPOSURE APPARATUS, EXPOSURE METHOD, AND DEVICE FABRICATION METHOD

BACKGROUND OF THE INVENTION

1. Field of the Invention

The present invention relates to an exposure apparatus, an exposure method, and a device fabrication method.

2. Description of the Related Art

A projection exposure apparatus has conventionally been employed to fabricate, for example, a micropatterned semiconductor device such as a semiconductor memory or logic circuit by using photolithography. The projection exposure apparatus transfers a circuit pattern formed on a reticle (mask) onto, for example, a wafer via a projection optical system.

A minimum dimension (resolution) that a projection exposure apparatus can transfer is proportional to the wavelength of exposure light and is inversely proportional to the numerical aperture (NA) of a projection optical system. The shorter the wavelength and the higher the NA, the better the resolution. Along with the recent demand for micropatterning semiconductor devices, the wavelength of exposure light is shortening and the NA of a projection optical system is increasing. For example, to shorten the wavelength of exposure light, an ArF excimer laser (wavelength: about 193 nm) or an $F_2$ laser (wavelength: about 157 nm) has become used as an exposure light source nowadays instead of a conventional KrF excimer laser (wavelength: about 248 nm). To increase the NA of a projection optical system, an optical system with an NA greater than 0.90 is under development.

Under the circumstances, immersion exposure is receiving a great deal of attention as a technique for further improving the resolution while using a light source such as an ArF excimer laser or $F_2$ laser. The immersion exposure further increases the NA of a projection optical system by using a liquid as a medium which fills the space under the projection optical system on the wafer side (image plane side). The NA of the projection optical system is $NA = n \cdot \sin\theta$ where n is the refractive index of the medium. It is therefore possible to increase the NA to n by filling at least part of the space between the projection optical system and the wafer with a medium (liquid) having a refractive index (n>1) higher than that of air. In other words, the immersion exposure improves the resolution by increasing the NA of the projection optical system seen from the wafer side (by 1 or more).

The exposure apparatus also has a sensor for measuring an optical characteristic and performs various types of mechanical adjustment and optical adjustment based on the output from the sensor, thereby optimizing the wafer exposure operation (exposure condition). For example, the exposure apparatus has an illuminance nonuniformity sensor or irradiation dose sensor on a wafer stage which supports a wafer. The illuminance nonuniformity sensor measures illuminance nonuniformity (light amount distribution) of exposure light having passed through the projection optical system. The irradiation dose sensor measures the irradiation dose (light amount) of exposure light having passed through the projection optical system.

These sensors receive light via a transmission part (measurement mark) formed on the image plane side of the projection optical system. As the numerical aperture of the projection optical system increases (the incident angle of exposure light with respect to the wafer increases) by immersion exposure, the angle of divergence of the light which emerges from the transmission part also increases. For this reason, the above-described sensors often cannot receive full-aperture light. However, the above-described sensors can receive full-aperture light by curving the exit side of a measurement substrate on which a transmission part is formed (drawn) or by arranging a planoconvex lens with a curvature to be in contact with or adjacent to a measurement substrate (i.e., by decreasing the angle of divergence of light). These techniques are proposed in Japanese Patent Laid-Open Nos. 2005-175034, 2005-268744, and 2005-129914.

Unfortunately, when the exit side of a measurement substrate is curved or a planoconvex lens with a curvature is arranged in contact with or adjacent to a measurement substrate, light at an off-axis position along the optical axis (the center of curvature) is distorted due to the curvature, although that at an on-axis position is free from any such influence. If the measurement substrate suffers a manufacturing error such as a drawing error generated upon drawing a transmission part or a positioning error of a planoconvex lens to be arranged in contact with or adjacent to the measurement substrate, incident light is distorted irrespective of whether it is on- or off-axis.

To measure a plurality of optical characteristics by one sensor, it is necessary to form a plurality of transmission parts corresponding to the respective characteristics on the measurement substrate. In this case, no problem is posed as long as the measurement substrate is a parallel plate. However, as described above, when the exit side of the measurement substrate is curved or a planoconvex lens with a curvature is arranged in contact with or adjacent to the measurement substrate, incident light is distorted depending on the positions (coordinate positions) of the transmission parts on the substrate.

Upon receiving light distorted due to such factors, the sensors output optical characteristic measurement results with errors (measurement errors), resulting in significant decreases in measurement precision. If a plurality of transmission parts is formed on a measurement substrate, regions where these transmission parts can be formed are limited under the influence of light distortion.

SUMMARY OF THE INVENTION

The present invention provides an exposure apparatus which is advantageous to increasing the NA by, for example, immersion exposure and can measure an optical characteristic with high precision.

According to one aspect of the present invention, there is provided an exposure apparatus which exposes a substrate via a liquid, comprising a projection optical system configured to project a pattern of a reticle onto the substrate, a measurement substrate which is inserted on an image plane of the projection optical system and includes a transmission part configured to transmit a light beam having passed through the projection optical system, a light-receiving unit including a light-receiving surface configured to receive the light beam transmitted through the liquid and the transmission part, and a calculator configured to arithmetically convert a light intensity distribution, on the light-receiving surface, of the light beam received by the light-receiving surface into a light intensity distribution on a pupil plane of the projection optical system, based on information indicating a correlation between a position coordinate on the light-receiving surface and a position coordinate on the pupil of the projection optical system.

According to another aspect of the present invention, there is provided an exposure method using an exposure apparatus which exposes a substrate via a liquid and comprises a projection optical system configured to project a pattern of a reticle onto the substrate, a measurement substrate which is inserted on an image plane of the projection optical system and includes a transmission part configured to transmit a light beam having passed through the projection optical system, and a light-receiving unit including a light-receiving surface configured to receive the light beam transmitted through the liquid and the transmission part, comprising steps of arithmetically converting a light intensity distribution, on the light-receiving surface, of the light beam received by the light-receiving surface into a light intensity distribution on a pupil plane of the projection optical system, based on information indicating a correlation between a position coordinate on the light-receiving surface and a position coordinate on the pupil of the projection optical system, and adjusting an optical characteristic of the exposure apparatus based on the conversion result obtained in the step of converting.

According to still another aspect of the present invention, there is provided a device fabrication method comprising steps of exposing a substrate using the above exposure apparatus, and performing a development process for the substrate exposed.

Further features of the present invention will become apparent from the following description of exemplary embodiments with reference to the attached drawings.

DESCRIPTION OF THE EMBODIMENT

Figure 1:
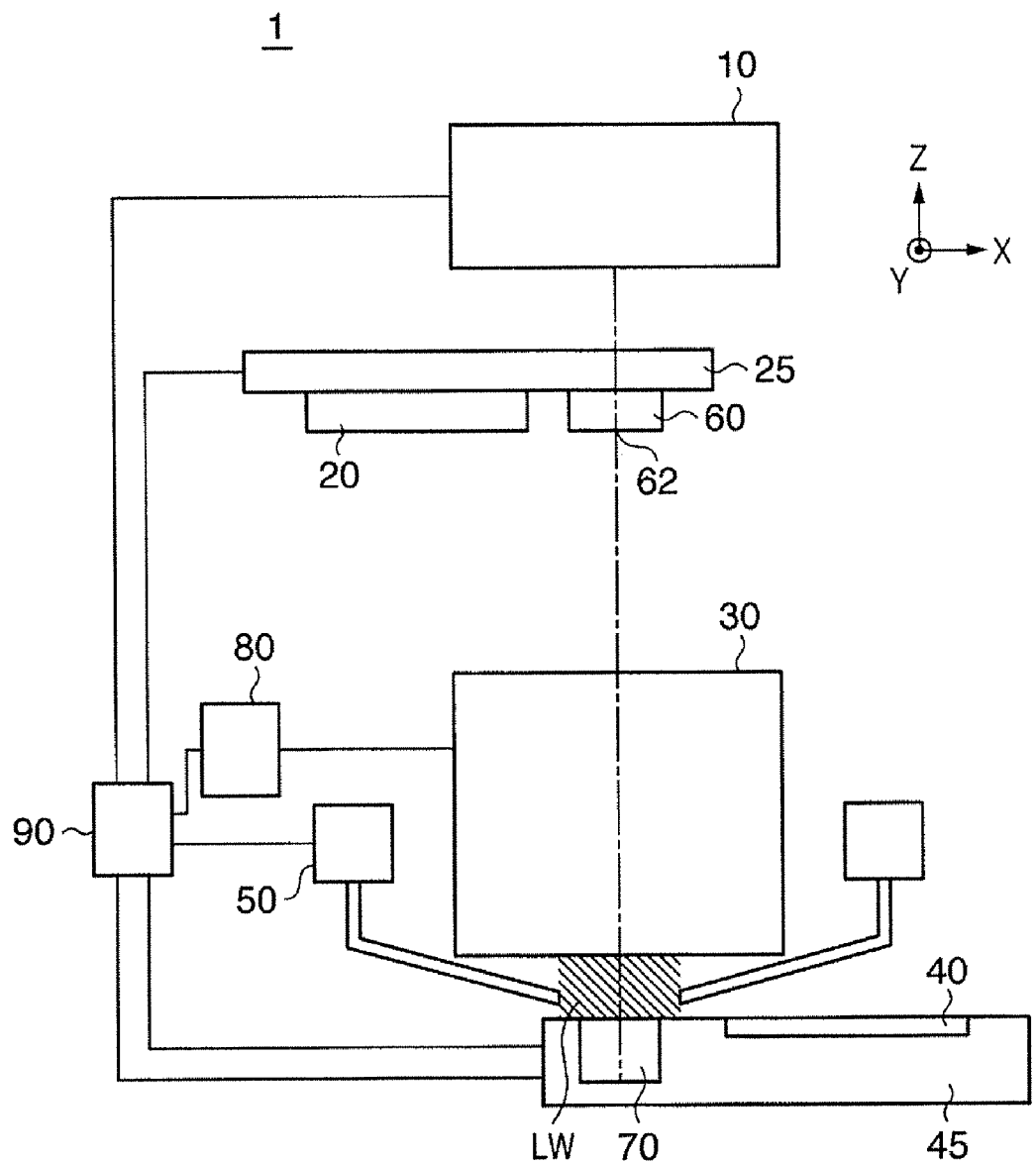
FIG. 1 is a schematic sectional view showing an exposure apparatus according to one aspect of the present invention.

A preferred embodiment of the present invention will be described below with reference to the accompanying drawings. The same reference numerals denote the same members throughout the drawings, and a repetitive description thereof will not be given.

FIG. 1 is a schematic sectional view showing the arrangement of an exposure apparatus 1 according to one aspect of the present invention. The exposure apparatus 1 is an immersion exposure apparatus which transfers the pattern of a reticle 20 onto a wafer 40 by exposure using the step & scan scheme via a liquid LW supplied between a projection optical system 30 and the wafer 40. However, the exposure apparatus 1 can also adopt the step & repeat scheme. As shown in FIG. 1, the exposure apparatus 1 includes an illumination apparatus 10, a reticle stage 25, the projection optical system 30, a wafer stage 45, a liquid supply-recovery mechanism 50, a reticle side reference plate 60, a light-receiving device 70, an adjuster 80, and a controller 90. The reticle side reference plate 60, light-receiving device 70, and controller 90 in the exposure apparatus 1 function as a measurement apparatus for measuring the optical characteristic of the exposure apparatus 1. FIG. 1 shows the state in which the optical characteristic of the exposure apparatus 1 is measured.

The illumination apparatus 10 illuminates the reticle 20 on which a circuit pattern to be transferred is formed, and includes a light source unit (not shown) and illumination optical system (not shown). The light source unit uses a laser such as a KrF excimer laser with a wavelength of about 248 nm, an ArF excimer laser with a wavelength of about 193 nm, or an $F_2$ laser with a wavelength of about 157 nm as a light source. The illumination optical system illuminates the reticle 20 with a light beam from the light source unit, and includes, for example, a lens, mirror, optical integrator, and stop.

The reticle 20 has a circuit pattern and is supported and driven by the reticle stage 25. Diffracted light generated by the reticle 20 is projected onto the wafer 40 via the projection optical system 30. Since the exposure apparatus 1 is of the step & scan scheme, it transfers the pattern of the reticle 20 onto the wafer 40 by scanning them.

The reticle stage 25 supports the reticle 20 and reticle side reference plate 60 (to be described later) and is connected to a driving mechanism (not shown). The driving mechanism (not shown) includes, for example, linear motors and can move the reticle 20 and reticle side reference plate 60 by driving the reticle stage 25 in at least the X direction. In transferring the pattern of the reticle 20 onto the wafer 40 by exposure, the reticle stage 25 inserts the reticle 20 onto the object plane of the projection optical system 30. In measuring the optical characteristic of the exposure apparatus 1, the reticle stage 25 inserts the reticle side reference plate 60 onto the object plane of the projection optical system 30. Note that the scanning direction of the reticle 20 or wafer 40 on its surface is defined as the X direction, a direction perpendicular to this direction on its surface is defined as the Y direction, and a direction perpendicular to the surface of the reticle 20 or wafer 40 is defined as the Z direction.

The projection optical system 30 projects the pattern of the reticle 20 onto the wafer 40. The projection optical system 30 can be, for example, a dioptric system or catadioptric system.

The wafer 40 is a substrate onto which the pattern of the reticle 20 is projected (transferred). However, it is also possible to use a glass plate or other substrates in place of the wafer 40. The wafer 40 is coated with a photoresist.

The wafer stage 45 supports the wafer 40 and light-receiving device 70 (to be described later). The wafer stage 45 can take any form known to those skilled in the art, and move the wafer 40 and light-receiving device 70 in the X, Y, and Z directions using, for example, linear motors. In transferring the pattern of the reticle 20 onto the wafer 40 by exposure, the wafer stage 45 inserts the wafer 40 onto the image plane of the projection optical system 30. In measuring the optical characteristic of the exposure apparatus 1, the wafer stage 45 inserts the light-receiving device 70 onto the image plane of the projection optical system 30.

Via a supply-recovery nozzle (not shown), the liquid supply-recovery mechanism 50 supplies the liquid LW between the projection optical system 30 (more specifically, the final surface of the projection optical system 30 on the side of the wafer 40) and the wafer 40 or light-receiving device 70, and recovers the supplied liquid LW. A space formed between the projection optical system 30 and the wafer 40 or light-receiving device 70 is filled with the liquid LW supplied from the liquid supply-recovery mechanism 50.

The liquid LW is a substance which has a relatively high transmittance and high refractive index with respect to the wavelength of exposure light, prevents dirt from adhering onto the final surface of the projection optical system 30, and exhibits a high chemical stability with respect to the final surface of the projection optical system 30 and the photoresist applied on the wafer 40. For example, the liquid LW is preferably a substance with a refractive index higher than 1 so as to increase the NA of the projection optical system 30. The difference in refractive index between the liquid LW and a refractive member (lens) which forms the final surface of the projection optical system 30 is preferably compensated for by coating the final surface of the projection optical system 30.

The reticle side reference plate 60 is arranged on the reticle stage 25 in the vicinity of the reticle 20, and has a reticle side transmission part 62 which transmits a light beam from the illumination apparatus 10. The reticle side reference plate 60 is fixed on the reticle stage 25 such that the reticle side transmission part 62 becomes nearly flush with the pattern surface of the reticle 20. In other words, the reticle side transmission part 62 of the reticle side reference plate 60 is inserted on the object plane of the projection optical system 30.

The reticle side transmission part 62 is formed from, for example, a diffraction pattern such as a line & space pattern, a pinhole, or a slit. Although the reticle side transmission part 62 is formed on the reticle side reference plate 60 in this embodiment, it may be formed on, for example, the reticle 20. The reticle side transmission part 62 has an arrangement similar to that of a wafer side transmission part 724 (to be described later), and a detailed description thereof will not be given herein.

Figure 2:
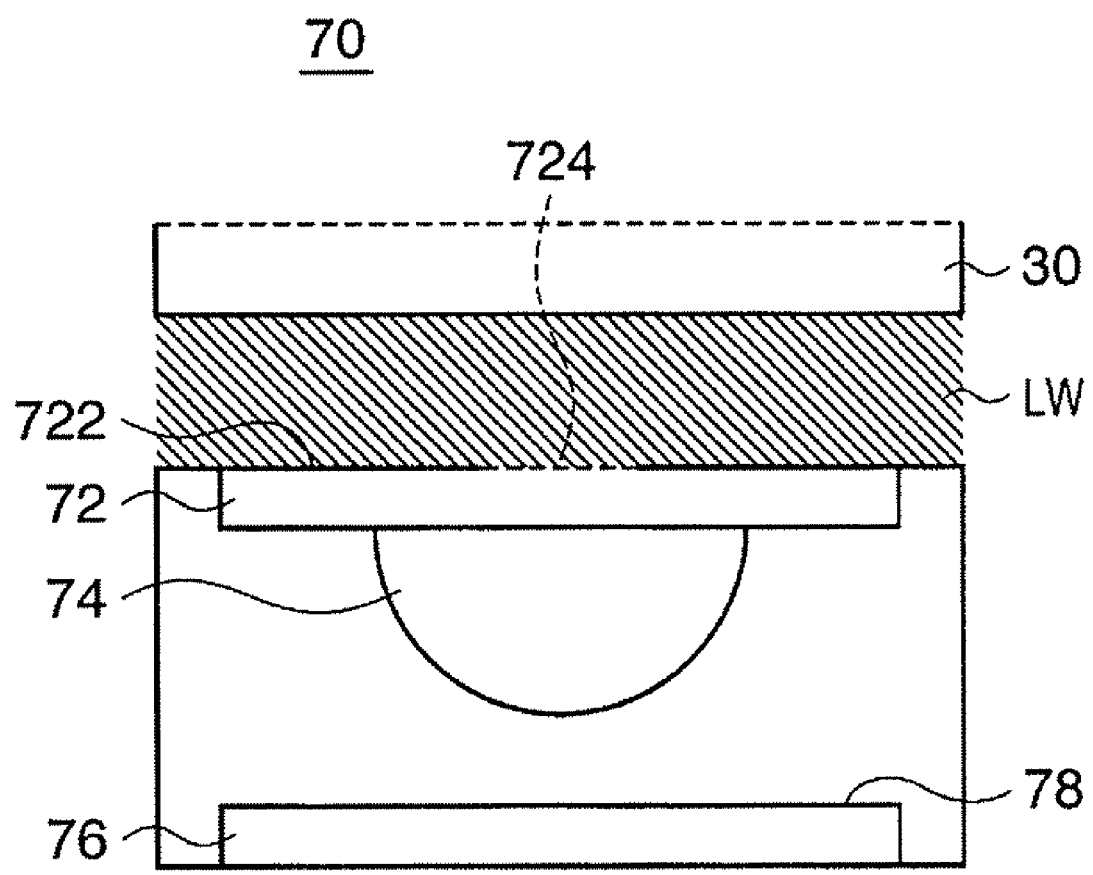
FIG. 2 is a schematic sectional view illustrating an example of the arrangement of a light-receiving device in the exposure apparatus shown in FIG. 1.

The light-receiving device 70 measures the optical characteristic of the exposure apparatus 1, is arranged on the wafer stage 45, and includes a measurement substrate 72, lens 74, and light-receiving unit 76, as shown in FIG. 2. If the polarization state of the projection optical system 30 is to be measured as the optical characteristic of the exposure apparatus 1, the light-receiving device 70 further includes a polarizer and analyzer. As described above, the exposure apparatus 1 has an arrangement in which the space between the projection optical system 30 and the light-receiving device 70 is filled with the liquid LW. The space between the lens 74 and the light-receiving unit 76 may be filled with a gas such as air or an inert gas or a liquid with a relatively high refractive index, such as the liquid LW. FIG. 2 is a schematic sectional view illustrating an example of the arrangement of the light-receiving device 70.

The optical characteristic of the exposure apparatus 1 herein includes the wavefront aberration of the projection optical system 30, the polarization state of the projection optical system 30, the numerical aperture of the projection optical system 30, the pupil transmittance of the projection optical system 30, and the pupil distribution (or coherence factor or effective light source distribution) of the illumination apparatus 10. However, the optical characteristic of the exposure apparatus 1 is not particularly limited to them, and includes other optical characteristics associated with the exposure performance of the exposure apparatus 1. In this embodiment, the optical performance of the exposure apparatus 1 is measured using at least one of the reticle side transmission part 62 and the wafer side transmission part 724.

The measurement substrate 72 is a wafer side reference plate and is formed from a glass substrate which transmits a light beam (exposure light) from the illumination apparatus 10. The measurement substrate 72 includes a light-shielding film 722 and the wafer side transmission part 724, which is inserted on the image plane of the projection optical system 30.

The light-shielding film 722 has a function of shielding a light beam from the illumination apparatus 10, and shields, for example, stray light other than light from the reticle side transmission part 62. The light-shielding film 722 is a thin film containing, for example, chromium (Cr), tantalum (Ta), tungsten (W), and silicon (Si), and forms the wafer side transmission part 724. Since the light-shielding film 722 comes into contact with the liquid LW, it is preferably made of a substance which does not change the characteristic of the liquid LW even when the light-shielding film 722 is irradiated with a light beam from the illumination apparatus 10.

Figure 3C:
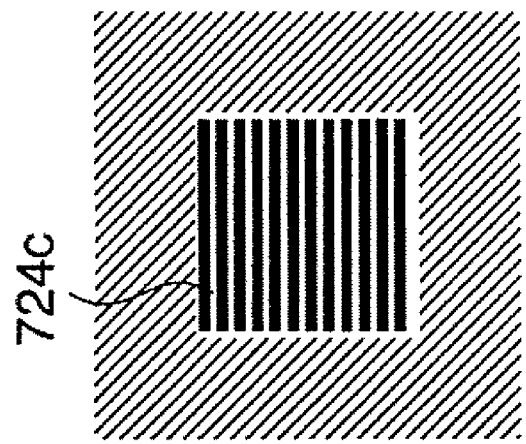
FIGS. 3A to 3C are views illustrating examples of the pattern of a wafer side transmission part of the light-receiving device shown in FIG. 2.
Figure 3B:
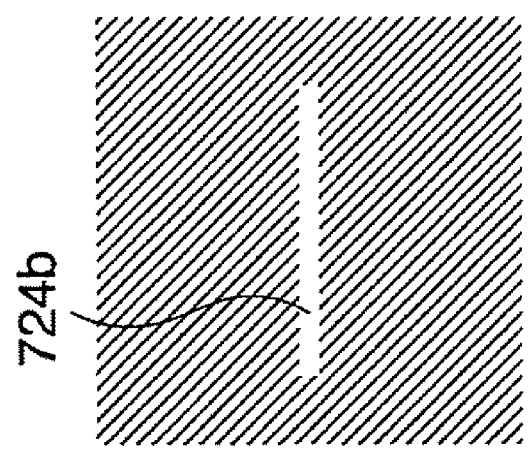
Figure 3A:
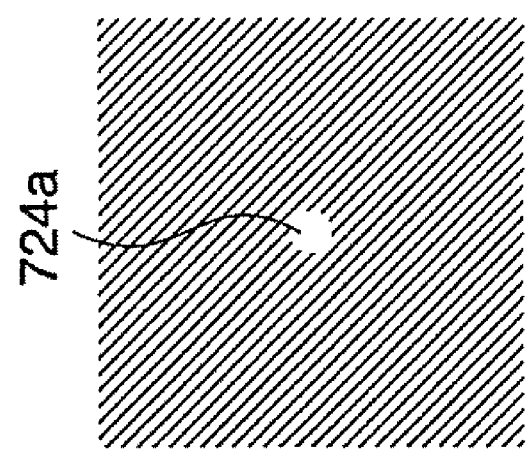

The wafer side transmission part 724 is inserted on the image plane of the projection optical system 30 and transmits a light beam having passed through the projection optical system 30. However, the wafer side transmission part 724 may be inserted at a position defocused from the reticle 20 and wafer 40, which are optically conjugate to it. The wafer side transmission part 724 is formed from a pattern such as a pinhole 724a as shown in FIG. 3A, a slit 724b as shown in FIG. 3B, or a diffraction grating 724c as shown in FIG. 3C. Although the pinhole 724a has a circular shape in this embodiment, it may have other shapes such as a square shape or rectangular shape. The slit 724b may have a width shorter than the wavelength of a light beam from the illumination apparatus 10 (i.e., a width which generates ideal diffraction), or may have a width that does not generate, for example, diffraction (i.e., a width which passes a light beam intact). The directions in which the patterns of the slit 724b and diffraction grating 724c extend are not particularly limited to the X and Y directions, and may be oblique directions. The wafer side transmission part 724 may solely use the pinhole 724a, slit 724b, and diffraction grating 724c, or may use one pattern as a combination thereof. FIGS. 3A to 3C are views illustrating examples of the pattern of the wafer side transmission part 724.

The lens 74 is inserted between the measurement substrate 72 and the light-receiving unit 76 to be adjacent to the measurement substrate 72 at a distance equal to or less than the wavelength of a light beam from the illumination apparatus 10. However, the lens 74 may be coupled to the measurement substrate 72 by optical contact, or may be mechanically coupled to the measurement substrate 72. The measurement substrate 72 and lens 74 may be integrated as one optical member instead of forming them as separate members.

In this embodiment, the lens 74 is formed from a plano-convex lens with a curvature (with a positive power), and is arranged adjacent to the measurement substrate 72 so that a light beam transmitted through the wafer side transmission part 724 is prevented from totally reflected by the lower surface of the measurement substrate 72. The lens 74 has a function of reducing the angle of divergence of a light beam transmitted through the wafer side transmission part 724. The curvature of the lens 74 needs to be set such that a light beam transmitted through the wafer side transmission part 724 is not totally reflected by the curved surface of the lens 74, in accordance with the NA of the light beam and the refractive index of the measurement substrate 72. In other words, the curvature of the lens 74 needs to be set such that the light-receiving unit 76 can receive all components of a high-NA light beam (a light beam transmitted through the wafer side transmission part 724). The lens 74 may be, for example, an aspherical lens or prism as long as it serves as an optical element which can project the pupil of the projection optical system 30 onto the light-receiving unit 76. The lens 74 need not always be formed from one lens and may be formed from a lens system including a plurality of lenses.

Figure 4:
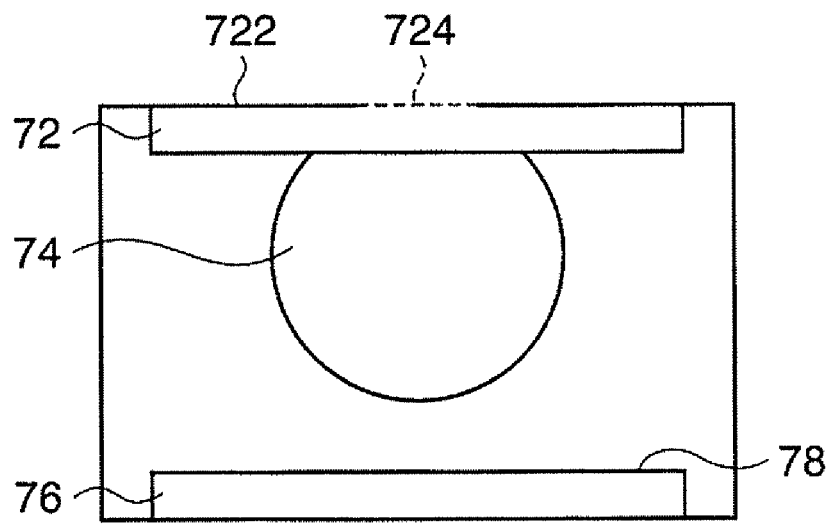
FIG. 4 is a schematic sectional view illustrating an example of the arrangement of the light-receiving device in the exposure apparatus shown in FIG. 1.
Figure 5:
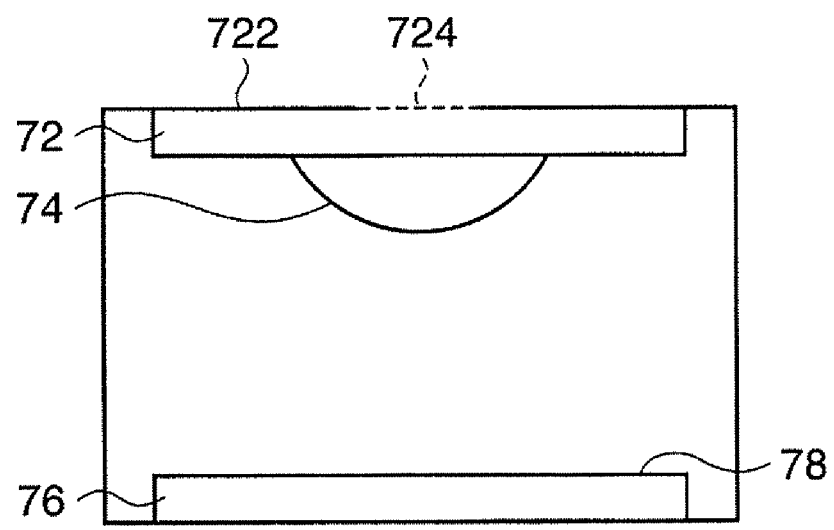
FIG. 5 is a schematic sectional view illustrating another example of the arrangement of the light-receiving device in the exposure apparatus shown in FIG. 1.

In this embodiment, as shown in FIG. 2, the lens 74 has a thickness (in the optical axis direction) equal to its radius of curvature. However, as shown in FIGS. 4 and 5, the lens 74 may have a thickness different from its radius of curvature. More specifically, the lens 74 shown in FIG. 4 has a thickness larger than its radius of curvature, while the lens 74 shown in FIG. 5 has a thickness smaller than its radius of curvature. FIGS. 4 and 5 are schematic sectional views illustrating examples of the arrangement of the light-receiving device 70.

The light-receiving unit 76 has a light-receiving surface 78 which receives a light beam transmitted through the wafer side transmission part 724. In this embodiment, the light-receiving unit 76 includes a two-dimensional sensor and can receive a light beam transmitted through the wafer side transmission part 724 at once. However, the light-receiving unit 76 may include a one-dimensional sensor or a light amount sensor and receive a light beam transmitted through the wafer side transmission part 724 while moving step by step.

The adjuster 80 has a function of adjusting the optical characteristic of the exposure apparatus 1, and is implemented as a driving mechanism which drives the optical member of the projection optical system 30 in this embodiment. The adjuster 80 adjusts the wavefront aberration and polarization state by, for example, driving the lens of the projection optical system 30 or rotating the lens about the optical axis under the control of the controller 90 (to be described later). The adjuster 80 can also adjust the NA of the projection optical system 30 by driving an NA stop of the projection optical system 30.

The controller 90 includes a CPU and memory (not shown) and controls the operation of the exposure apparatus 1. The controller 90 is electrically connected to the illumination apparatus 10, reticle stage 25, wafer stage 45, and liquid supply-recovery mechanism 50, and controls the scanning speeds of the reticle stage 25 and wafer stage 45 and an operation associated with immersion exposure. For example, the controller 90 controls switching between the supply, recovery, and supply/recovery stop of the liquid LW and the supply/recovery amount of the liquid LW based on a condition such as the scanning direction of the wafer stage 45 in exposure. In addition, the controller 90 is electrically connected to the light-receiving device 70 (light-receiving unit 76) and adjuster 80, and controls the optical characteristic of the exposure apparatus 1 via the adjuster 80 based on the output from the light-receiving unit 76.

However, when the optical characteristic of the exposure apparatus 1 is measured using the light-receiving device 70 (and reticle side reference plate 60) while the wafer side transmission part 724 is decentered (shifted) from the center of curvature of the lens 74, the light-receiving unit 76 outputs a measurement result including an error. The wafer side transmission part 724 is decentered from the center of curvature of the lens 74 when the lens 74 is arranged on the measurement substrate 72 including the wafer side transmission part 724. If the measurement substrate 72 and lens 74 are integrated as one optical member, the wafer side transmission part 724 is decentered from the center of curvature of the lens 74 depending on, for example, the accuracy of coupling between the measurement substrate 72 and the lens 74 and the formation accuracy of the wafer side transmission part 724.

Figure 6:
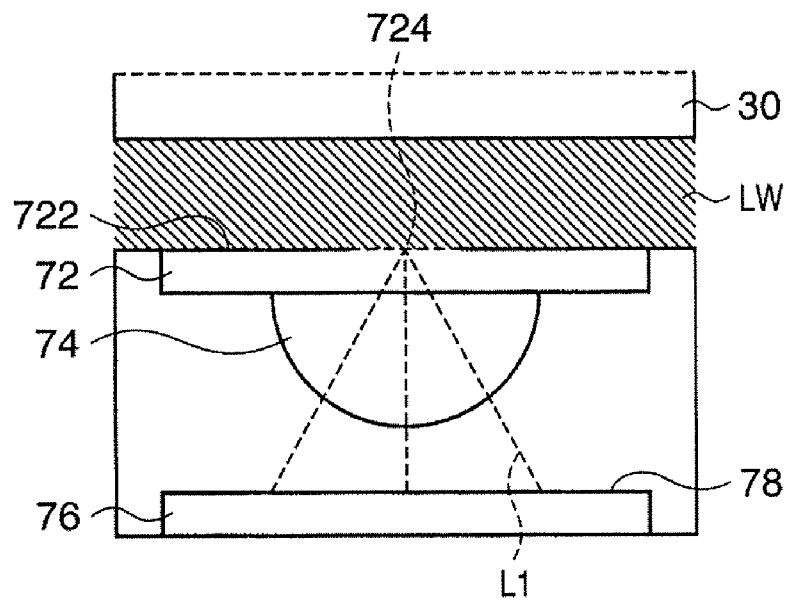
FIG. 6 is a schematic sectional view for explaining a measurement error due to decentering of the wafer side transmission part from the center of curvature of a lens in the light-receiving device shown in FIG. 2.
Figure 7:
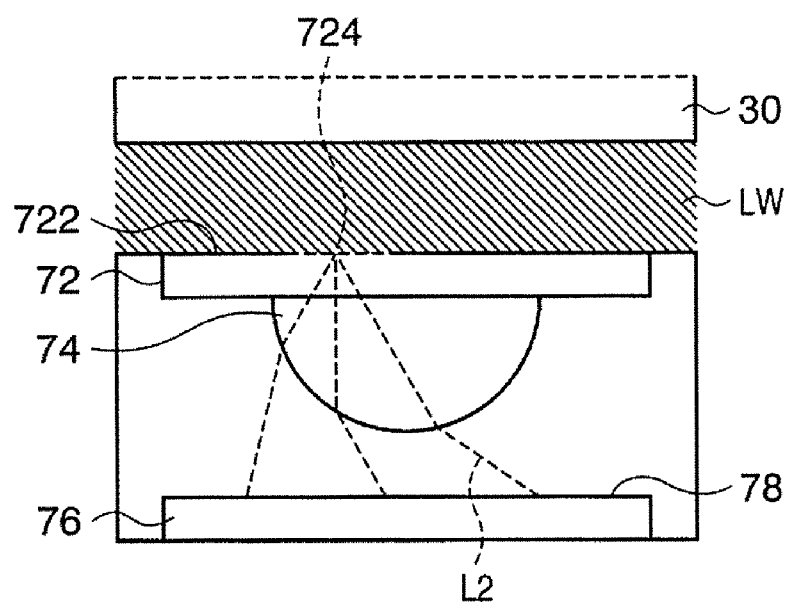
FIG. 7 is a schematic sectional view for explaining a measurement error due to decentering of the wafer side transmission part from the center of curvature of the lens in the light-receiving device shown in FIG. 2.

A measurement error due to decentering of the wafer side transmission part 724 from the center of curvature of the lens 74 will be explained in detail with reference to FIGS. 6 and 7. FIG. 6 exemplifies a case in which the wafer side transmission part 724 is not decentered from the center of curvature of the lens 74 (i.e., the wafer side transmission part 724 matches the center of curvature of the lens 74). FIG. 7 exemplifies a case in which the wafer side transmission part 724 is decentered from the center of curvature of the lens 74 (i.e., the wafer side transmission part 724 is shifted from the center of curvature of the lens 74).

If the wafer side transmission part 724 matches the center of curvature of the lens 74, a light beam transmitted through the wafer side transmission part 724 symmetrically enters the light-receiving unit 76 (light-receiving surface 78), as shown in FIG. 6. If the wafer side transmission part 724 is shifted from the center of curvature of the lens 74, a light beam transmitted through the wafer side transmission part 724 asymmetrically enters the light-receiving unit 76 (light-receiving surface 78), as shown in FIG. 7. In other words, a light beam transmitted through the wafer side transmission part 724 enters the light-receiving unit 76 while being distorted due to the curvature of the lens 74. Such distortion due to the curvature of the lens 74 causes a measurement error of the light-receiving unit 76. The more the wafer side transmission part 724 is shifted from the center of curvature of the lens 74, the larger the amount of distortion due to the curvature of the lens 74. This makes it necessary to arrange the lens 74 on the measurement substrate 72 such that the amount of shift between the wafer side transmission part 724 and the center of curvature of the lens 74 falls within the allowable range, in accordance with the required measurement precision of the optical characteristic of the exposure apparatus 1. However, it is difficult in practice to arrange the lens 74 on the measurement substrate 72 such that the wafer side transmission part 724 matches the center of curvature of the lens 74 or such that the amount of shift between the wafer side transmission part 724 and the center of curvature of the lens 74 falls within the allowable range.

To solve this problem, in this embodiment, the controller 90 executes processing of correcting the influence of distortion of a light beam due to a shift of the wafer side transmission part 724 from the center of curvature of the lens 74 to be able to measure the optical characteristic of the exposure apparatus 1 with high precision. The controller 90 functions as a calculator which arithmetically converts the light intensity distribution, on the light-receiving surface 78, of a light beam received by the light-receiving surface of the light-receiving unit 76 into that on the pupil plane of the projection optical system 30 based on information indicating the correlation between position coordinates on the light-receiving surface 78 and those on the pupil of the projection optical system 30. In other words, the controller 90 converts the light intensity distribution on the light-receiving surface 78 of the light-receiving unit 76 into that on the pupil plane of the projection optical system 30. As will be explained in detail later, the controller 90 divides a region on the pupil plane of the projection optical system 30 into a plurality of elements arrayed in a grid pattern, and determines the light intensities in the plurality of elements based on the value (light amount) of at least one of a plurality of pixels arrayed on the light-receiving surface 78 in a grid pattern. For example, consider a case in which a light beam which emerges from one of the plurality of elements on the pupil plane of the projection optical system 30 enters two or more pixels on the light-receiving surface 78. In this case, the controller 90 calculates the light intensity in one element on the pupil plane of the projection optical system 30 based on the values (light amounts) of the two or more pixels and the areas, in the two or more pixels, of the light beam components which enter the two or more pixels. More specifically, the controller 90 multiplies the ratios of areas, in the two or more pixels, of the light beam components which enter the two or more pixels by the values of the two or more pixels, thereby calculating the light intensity in one element on the pupil plane of the projection optical system 30. The controller 90 controls the adjuster 80 based on the conversion result obtained by converting the light intensity distribution on the light-receiving surface 78 of the light-receiving unit 76 into that on the pupil plane of the projection optical system 30.

Figure 8:
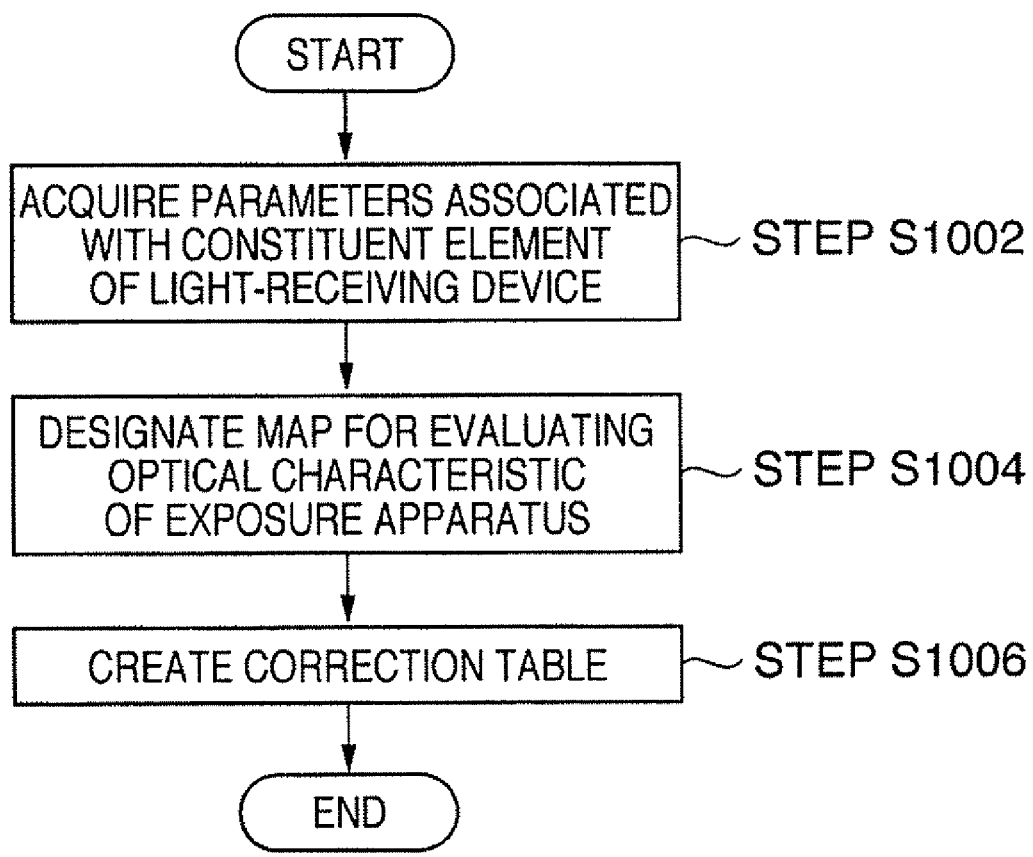
FIG. 8 is a flowchart for explaining correction processing by a controller in the exposure apparatus shown in FIG. 1.

The correction processing executed by the controller 90 will be explained with reference to FIG. 8. FIG. 8 is a flowchart for explaining the correction processing by the controller 90.

In step S1002, parameters associated with a constituent element of the light-receiving device 70 are acquired. The parameters associated with the constituent element of the light-receiving device 70 influence the precision of measuring the optical characteristic of the exposure apparatus 1. The parameters associated with the constituent element of the light-receiving device 70 include at least the amount of shift between the wafer side transmission part 724 and the center of curvature of the lens 74 (the position coordinates of the wafer side transmission part 724 with respect to the center of curvature of the lens 74). The parameters associated with the constituent element of the light-receiving device 70 also include the refractive index and thickness of the measurement substrate 72, and the radius of curvature, the refractive index, and the thickness of the lens 74. The parameters associated with the constituent element of the light-receiving device 70 also include the distance between the wafer side transmission part 724 and the light-receiving surface 78, and the tilt of the light-receiving surface 78.

The parameters acquired in step S1002 may be measured in assembling the light-receiving device 70 or may be measured after mounting the light-receiving device 70 into the exposure apparatus 1. If the parameters are measured after mounting the light-receiving device 70 into the exposure apparatus 1, a stop of the illumination optical system of the illumination apparatus 10 is used or a specific pattern which generates specific diffracted light is formed at an appropriate position on the reticle 20. The stop of the illumination optical system is inserted at a position optically, nearly conjugate to the pupil of the projection optical system 30, and has a specific aperture with, for example, a dipolar shape or multipolar shape. When the light-receiving unit 76 receives a light beam which has a known NA and is generated by the stop or specific pattern, it is possible to measure, for example, the amount of shift between the wafer side transmission part 724 and the center of curvature of the lens 74, the distance between the wafer side transmission part 724 and the light-receiving surface 78, and the tilt of the light-receiving surface 78. The parameters acquired in step S1002 may be design values instead of the actual measurement values of the constituent element of the light-receiving device 70.

In step S1004, a map for evaluating the optical characteristic of the exposure apparatus 1 is designated. Although the map in this embodiment is a pupil map used in converting the position of a light beam received by the light-receiving surface 78 on the light intensity distribution into that on the pupil of the projection optical system 30, the present invention is not particularly limited to this. Also in this embodiment, pupil map regions and their number are designated in step S1004. A value which depends on the NA of the projection optical system 30 and is slightly higher than it is preferably designated as the pupil map region.

Figure 9:
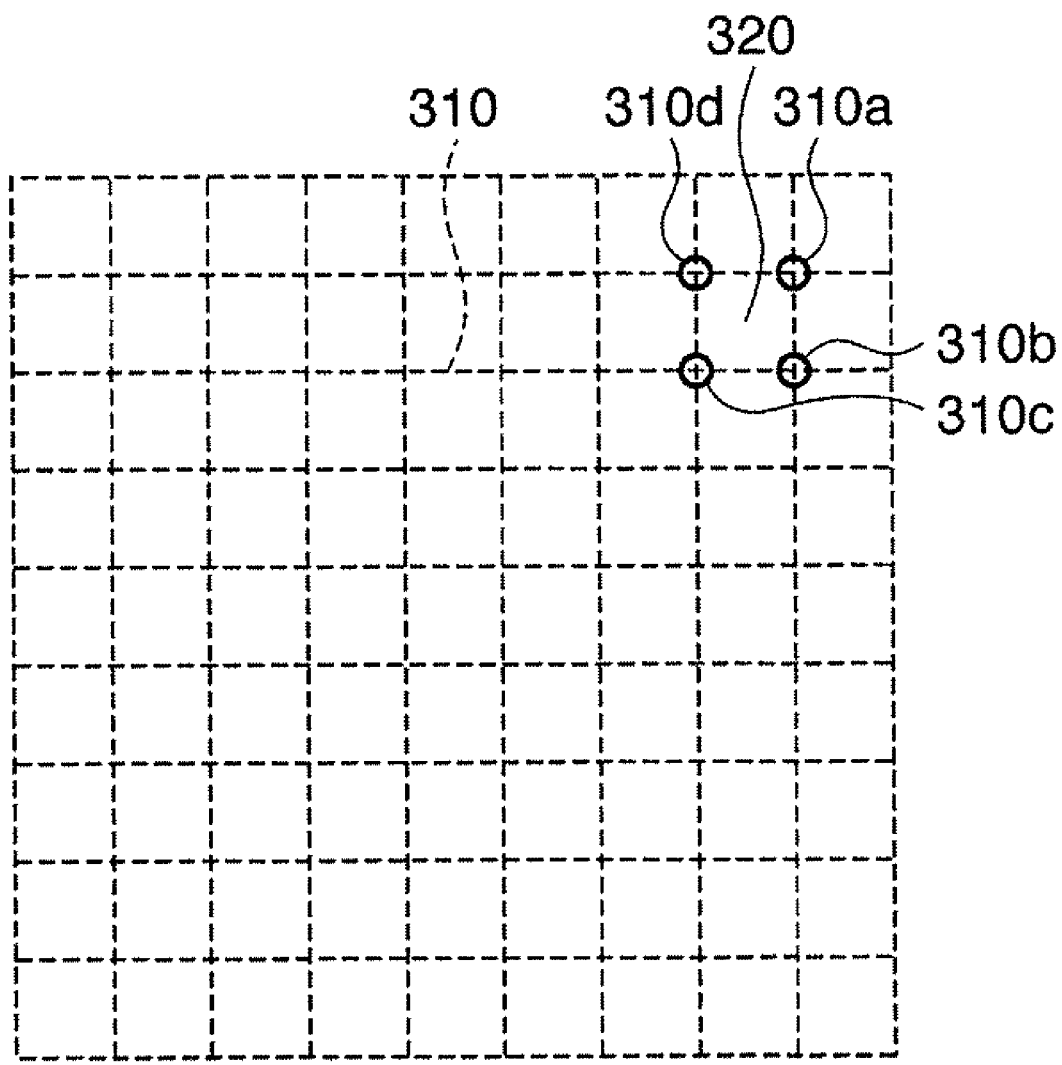
FIG. 9 is a diagram illustrating an example of a pupil map designated in step S1004 of FIG. 8.

FIG. 9 is a diagram illustrating an example of a pupil map 300 designated in step S1004. Although the pupil map 300 is divided into 9×9 in FIG. 9, the number of division is not particularly limited to this. Broken lines 310 indicate coordinates on the pupil map 300. In other words, the pupil map 300 is obtained by dividing a region on the pupil plane of the projection optical system 30 into a plurality of elements arrayed in a grid pattern.

In step S1006, a correction table is created using the parameters acquired in step S1002 and the map (pupil map) designated in step S1004. In this embodiment, a correction table is created by tracing a light beam which enters the light-receiving surface 78 of the light-receiving unit 76 from the wafer side transmission part 724 (by executing ray trace assuming the wafer side transmission part 724 as the origin) in consideration of the parameters acquired in step S1002. In other words, the use of the parameters acquired in step S1002 allows ray trace by which the incident position, on the light-receiving surface 78, of a light beam from the wafer side transmission part 724 is traced.

Figure 10:
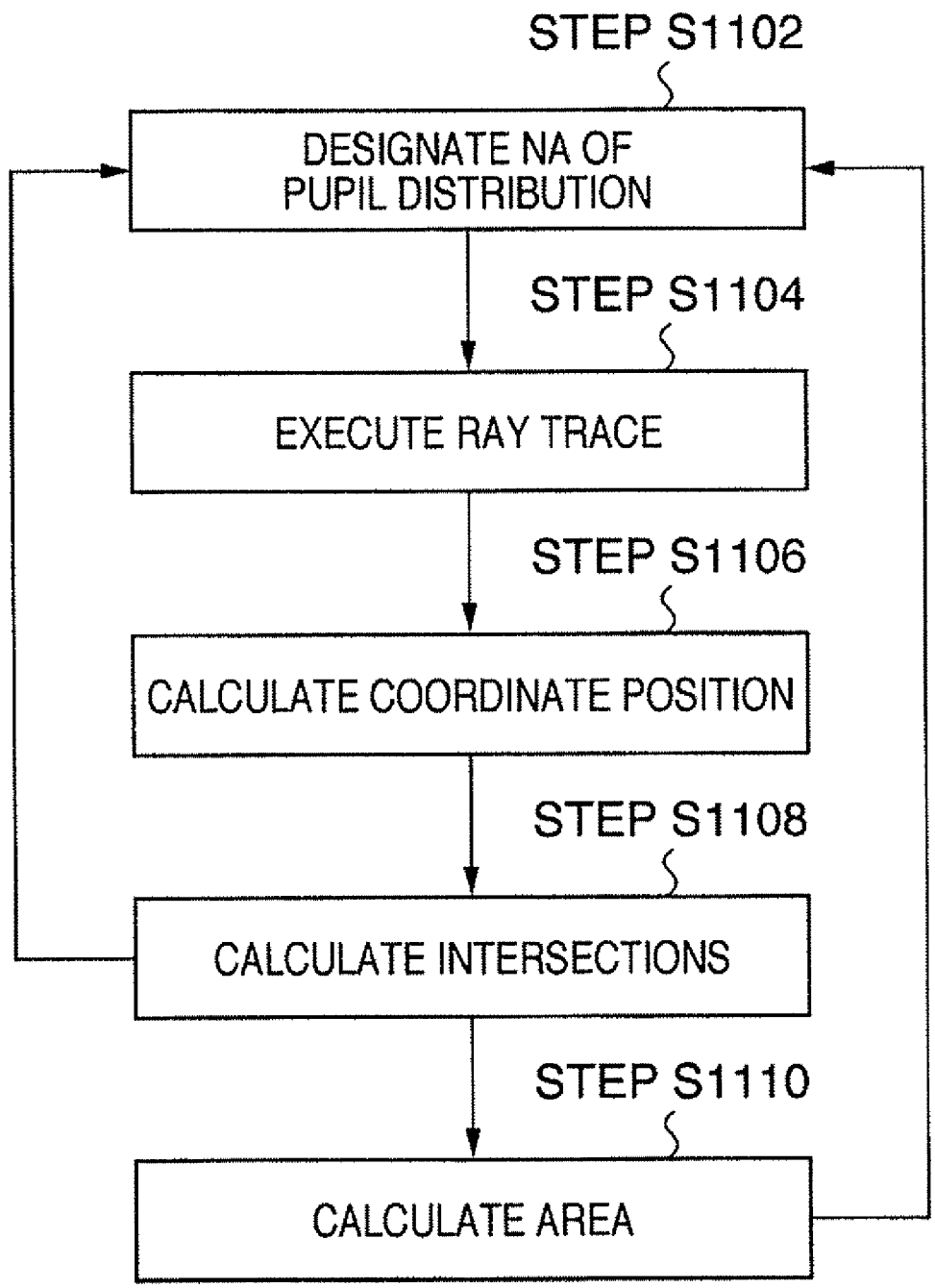
FIG. 10 is a flowchart for explaining correction table creation in step S1006 of FIG. 9.

The correction table creation in step S1006 will be explained in detail herein. FIG. 10 is a flowchart for explaining the correction table creation in step S1006. Referring to FIG. 10, the NA of the pupil map 300 designated in step S1004 is designated first in step S1102. More specifically, the NA of the pupil map 300 shown in FIG. 9 is designated by designating four intersections (for example, intersections 310a, 310b, 310c, and 310d) between the broken lines 310. This embodiment assumes that an incident coordinate position 320 defined by the intersections 310a to 310d is designated as the NA of the pupil map 300.

In step S1104, ray trace is executed by tracing the incident position, on the light-receiving surface 78 of the light-receiving unit 76, of a light beam having entered the wafer side transmission part 724 from the incident coordinate position 320 (each of the four intersections 310a to 310d) designated in step S1102.

Figure 11:
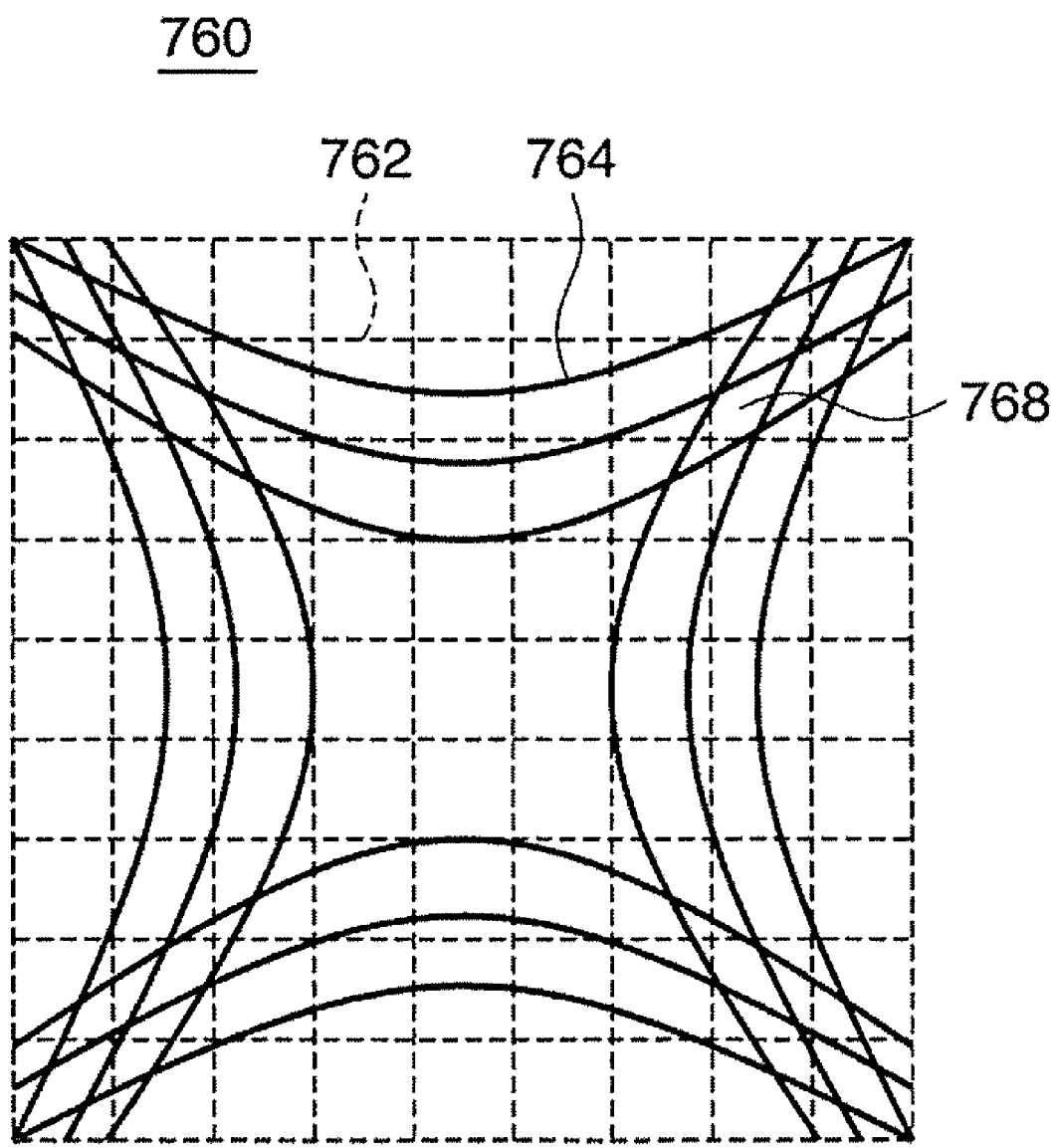
FIG. 11 is a diagram illustrating an example of a light-receiving surface map on the light-receiving surface of a light-receiving unit of the light-receiving device shown in FIG. 2.
Figure 12:
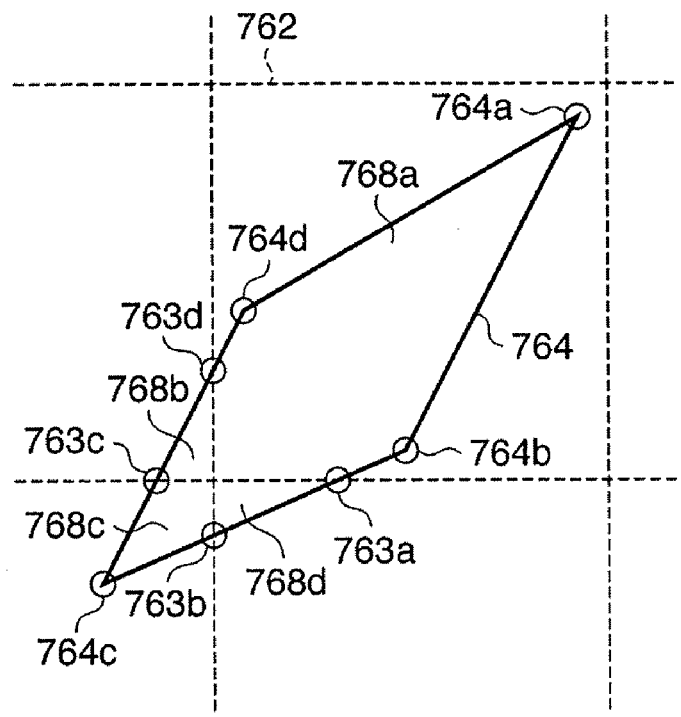
FIG. 12 is an enlarged diagram of an incident region, where a light beam from an incident coordinate position shown in FIG. 9 enters, on the light-receiving surface map shown in FIG. 11.

FIG. 11 is a diagram illustrating an example of a light-receiving surface map 760 on the light-receiving surface 78 of the light-receiving unit 76. The light-receiving surface map 760 indicates the incident position of a light beam from the pupil map 300 on the light-receiving surface 78. In FIG. 11, broken lines 762 indicate coordinates on the light-receiving surface map 760 (i.e., a plurality of pixels arrayed on the light-receiving surface 78 in a grid pattern). Solid lines 764 indicate the coordinate positions where light beams from the pupil map 300 enter the light-receiving surface map 760. For example, a light beam from the incident coordinate position 320 shown in FIG. 9 enters an incident region 768 surrounded by the solid lines 764. FIG. 12 is an enlarged view of the incident region 768. Four intersections 764a, 764b, 764c, and 764d between the solid lines 764 shown in FIG. 12 are calculated by the ray tracing in step S1104. The intersections between the broken lines 762 are calculated by the light-receiving unit 76 (pixels of the light-receiving surface 78). It is therefore possible to calculate intersections 763a, 763b, 763c, and 763d between the solid lines 764 and the broken lines 762.

In this manner, in the intersection calculation in step S1106, a coordinate position, on the light-receiving surface map 760, corresponding to the incident coordinate position 320 designated in step S1102 is calculated based on the result of the ray trace in step S1104. In step S1108, the intersections between the incident region 768 and the coordinate position (broken lines 762) on the light-receiving surface map 760 are calculated.

In the area calculation of step S110, the area of the incident region 768 is calculated based on the intersections between the incident region 768 and the coordinate position on the light-receiving surface map 760, which are calculated in step S1108. A light beam from the incident coordinate position 320 enters the incident region 768, as described above. Hence, the light amount at the incident coordinate position 320 is the sum of values obtained by multiplying the ratios of areas of regions 768a, 768b, 768c, and 768d to respective pixels on the light-receiving surface map 760 by the light amounts in the respective pixels on the light-receiving surface map 760.

Figure 13:
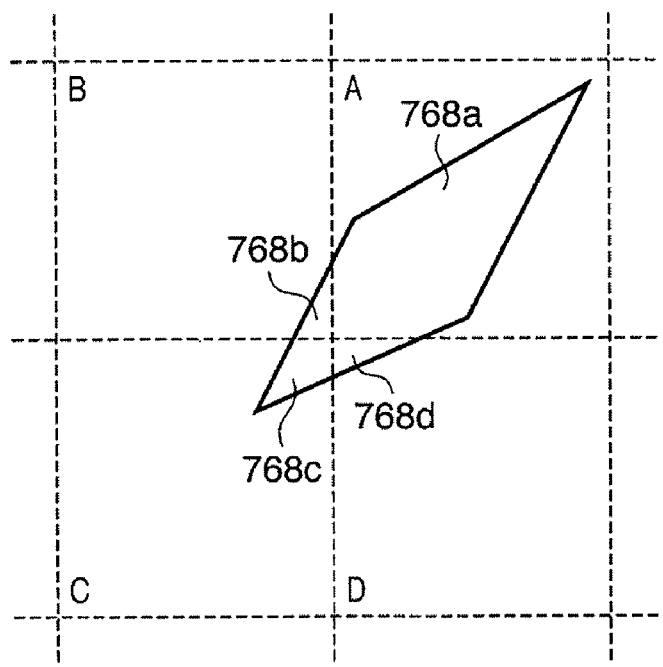
FIG. 13 is a diagram for explaining how to calculate the light amount at the incident coordinate position on the pupil map shown in FIG. 9.

The calculation of the light amount at the incident coordinate position 320 will be explained in detail with reference to FIG. 13. FIG. 13 schematically shows four pixel regions, where light beam components from the incident coordinate position 320 enter, on the light-receiving surface map 760. In FIG. 13, let AA, AB, AC, and AD be the areas of four pixels A, B, C, and D surrounded by broken lines, IA, IB, IC, and ID be the light amounts in the pixels A, B, C, and D, and AE, AF, AG, and AH be the areas of the regions 768a, 768b, 768c, and 768d on the light-receiving surface map 760. Then, the light amount at the incident coordinate position 320 is calculated by AE/AA×IA+AF/AB×IB +AG/AC×IC+AH/AD×ID.

When each coordinate position on the pupil map 300 undergoes the processes in steps S1102 to S1110, it is possible to calculate the area correlation of the light-receiving surface map 760 with respect to the light amount at each coordinate position on the pupil map 300. The controller 90 can correct the influence of distortion of a light beam due to a shift of the wafer side transmission part 724 from the center of curvature of the lens 74 by referring to the calculated area correlation as a correction table.

Although the correction table creation in step S1106 (steps S1102 to S1110) is done on the main body (i.e., by the controller 90) of the exposure apparatus 1, a computer separate from the exposure apparatus 1 may be used. However, when a correction table is created on the main body of the exposure apparatus 1, it is possible to measure the parameters obtained in step S1002 and thereby reflect the measurement values on the calculation.

In this embodiment, a correction table for correcting the influence of distortion of a light beam due to a shift of the wafer side transmission part 724 from the center of curvature of the lens 74 is created. However, this correction table is effective even for a light-receiving device without the lens 74, a case in which the wafer side transmission part 724 is not shifted from the center of curvature of the lens 74 as shown in FIG. 6, and a case in which the lens 74 is unnecessary because the NA of the projection optical system 30 is relatively low. In these cases, distortion due to the lens 74 does not occur, but such a correction table can be used to correct the influences of, for example, the thickness of the measurement substrate 72, the distance between the measurement substrate 72 and the light-receiving surface 78, and the tilt of the light-receiving unit 76.

Figure 14:
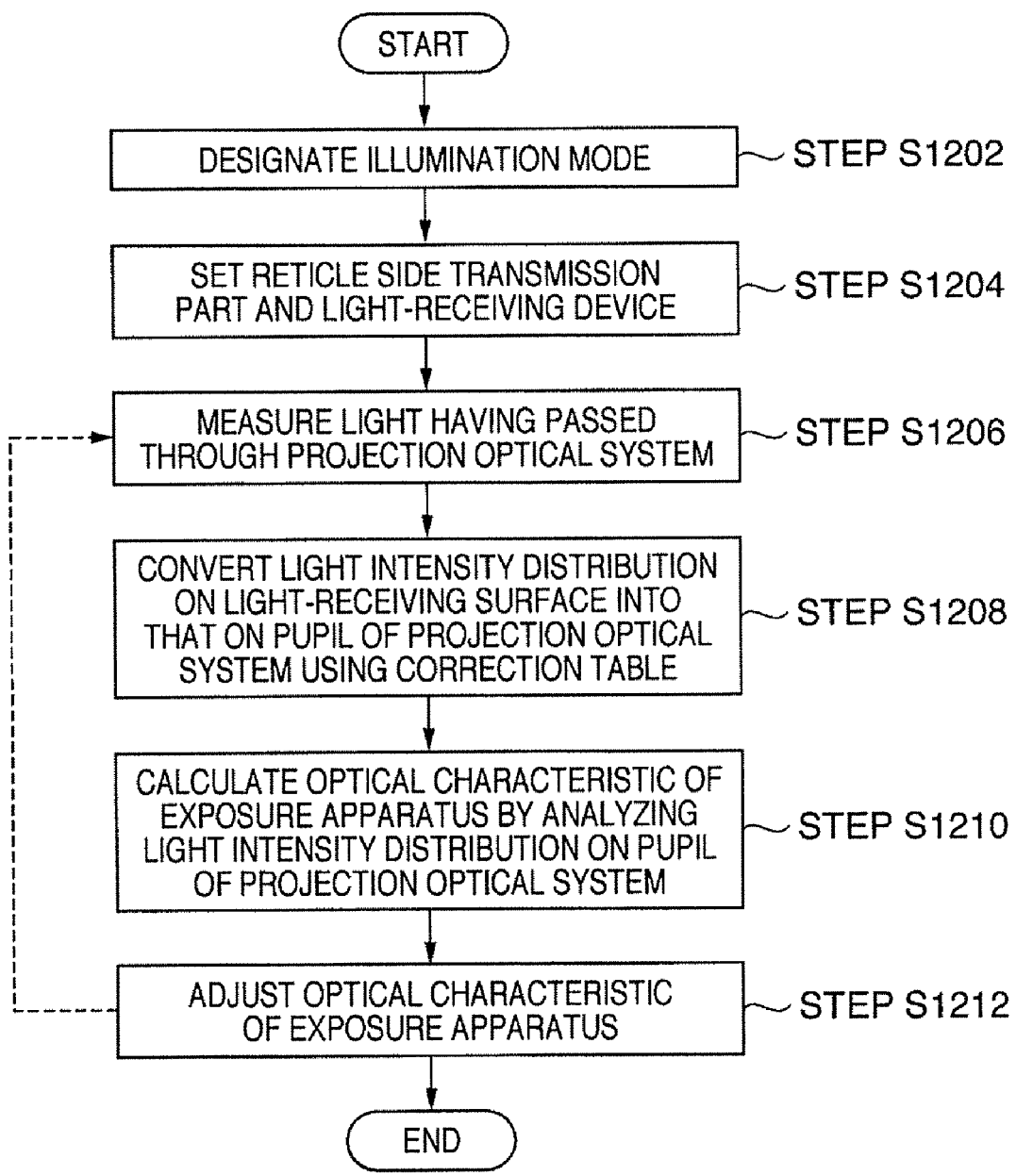
FIG. 14 is a flowchart for explaining an exposure method in the exposure apparatus shown in FIG. 1.

An exposure method using the correction table in the exposure apparatus 1 will be explained with reference to FIG. 14. FIG. 14 is a flowchart for explaining an exposure method in the exposure apparatus 1. In this embodiment, a correction table for correcting the influence of distortion of a light beam due to a shift of the wafer side transmission part 724 from the center of curvature of the lens 74 is created in advance. However, a correction table may be created in measuring the optical characteristic of the exposure apparatus 1.

Referring to FIG. 14, the illumination mode in which the optical characteristic of the exposure apparatus 1 is measured is designated in step S1202. The illumination mode designated in step S1202 is practiced by, for example, driving the lens and stop of the illumination optical system of the illumination apparatus 10.

In step S1204, the reticle side transmission part 62 is inserted onto the object plane of the projection optical system 30 using the reticle stage 25, and the light-receiving device 70 is inserted onto the image plane of the projection optical system 30 using the wafer stage 45. The reticle side transmission part 62 is sometimes not used depending on the optical characteristic of the exposure apparatus 1 to be measured.

In step S1206, the light-receiving unit 76 (light-receiving surface 78) of the light-receiving device 70 receives (measures) light having passed through the projection optical system 30. In this embodiment, the light intensity distribution of light having passed through the projection optical system 30 is measured.

In step S1208, the light intensity distribution, on the light-receiving surface 78, of the light having passed through the projection optical system 30, which is measured in step S1206, is converted into the light intensity distribution on the pupil plane of the projection optical system 30.

In step S1210, the optical characteristic of the exposure apparatus 1 is calculated by analyzing the light intensity distribution on the pupil plane of the projection optical system 30, which is obtained in step S1208.

In step S1212, the optical characteristic of the exposure apparatus 1 is adjusted based on its value calculated in step S1210. More specifically, the optical members of the projection optical system 30 and the illumination optical system of the illumination apparatus 10 are driven. By repeating the processes in steps S1206 to S1212, the optical characteristic of the exposure apparatus 1 can be optimized.

After the adjustment of the optical characteristic of the exposure apparatus 1 is completed, the reticle 20 is inserted onto the object plane of the projection optical system 30, and the wafer 40 is inserted onto the image plane of the projection optical system 30. The pattern of the reticle 20 is then transferred onto the wafer 40 by exposure.

In this manner, the exposure apparatus 1 can measure its optical characteristic with high precision using a correction table for correcting the influence of distortion of a light beam due to a shift of the wafer side transmission part 724 from the center of curvature of the lens 74, while using the high-NA projection optical system 30. In other words, the exposure apparatus 1 can measure and adjust its optical characteristic with high precision by converting the light intensity distribution on the light-receiving surface 78 of the light-receiving unit 76 into that on the pupil plane of the projection optical system 30 using the correction table, thus attaining an excellent exposure performance. Hence, the exposure apparatus 1 can provide devices (e.g., a semiconductor device and liquid crystal display device) with high throughput, a good economical efficiency, and high quality. The devices are fabricated by a step of exposing a substrate (e.g., a wafer or glass plate) coated with a resist (photosensitive agent) using the exposure apparatus 1, a step of developing the substrate exposed in the exposing step, and other known steps.

Figure 15:
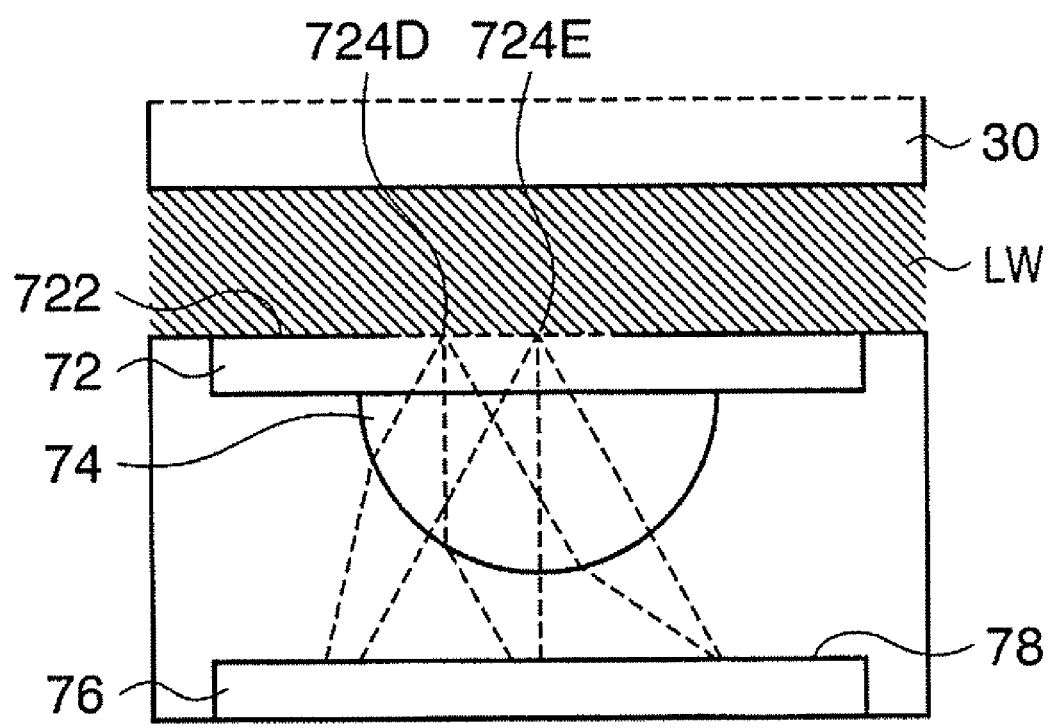
FIG. 15 is a schematic sectional view illustrating still another example of the arrangement of the light-receiving device in the exposure apparatus shown in FIG. 1.

Although a case in which the light-receiving device 70 has only one wafer side transmission part 724 has been exemplified above, the present invention is also applicable to a case in which a light-receiving device 70A has a plurality of wafer side transmission parts 724D and 724E, as shown in FIG. 15. The light-receiving device 70A has the plurality of wafer side transmission parts 724D and 724E, and uses them in correspondence with the optical characteristic of the exposure apparatus 1 to be measured. In other words, the light-receiving device 70A can measure a plurality of optical characteristics. The plurality of wafer side transmission parts 724D and 724E may be provided to measure the same optical characteristic by different measurement methods, or may be provided as spares from the viewpoint of, for example, durability. FIG. 15 is a schematic sectional view illustrating an example of the arrangement of the light-receiving device 70A in the exposure apparatus 1.

In the light-receiving device 70A, the influence of distortion due to decentering between the lens 74 and the wafer side transmission part 724D or 724E changes depending on the position of the wafer side transmission part 724D or 724E relative to the center of curvature of the lens 74. In view of this, when a light-receiving device has a plurality of wafer side transmission parts as in the light-receiving device 70A, correction tables corresponding to them are created. Providing correction tables corresponding to the plurality of wafer side transmission parts makes it possible to arrange (form) the wafer side transmission parts not only in the vicinity of the center of curvature of the lens 74 but also across a wide range on the measurement substrate 72.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-134584 filed on May 21, 2007, which is hereby incorporated by reference herein in its entirety.

What is claimed is:

1. An exposure apparatus comprising:
   a projection optical system configured to project a pattern of a reticle onto a substrate;
   a measurement substrate which is inserted on an image plane of said projection optical system and includes a transmission part configured to transmit a light beam having passed through said projection optical system;
   a light-receiving unit including a light-receiving surface configured to receive the light beam transmitted through a liquid and said transmission part; and
   a calculator configured to arithmetically convert a light intensity distribution, on said light-receiving surface, of the light beam received by said light-receiving surface into said light intensity distribution on a pupil plane of said projection optical system, based on information indicating a correlation between a position coordinate on said light-receiving surface and a position coordinate on the pupil of said projection optical system,
   wherein the calculator divides a region of the pupil plane into a plurality of elements arrayed in a grid pattern, and said calculator calculates a light intensity of one element of the plurality of elements by multiplying a light amount in at least one pixel on said light-receiving surface by a ratio of an area of the region on said light-receiving surface where light having passed through the one element reaches said pixel on said light-receiving surface and a total area of said pixel.

2. The apparatus according to claim 1, further comprising a lens which has a curvature and is inserted between said measurement substrate and said light-receiving unit to be adjacent to said measurement substrate at a distance not more than a wavelength of the light beam.

3. The apparatus according to claim 2, wherein the information indicating the correlation is created by ray tracing at least from said transmission part to said light-receiving surface, based on decentering of said transmission part from the center of curvature of said lens.

4. The apparatus according to claim 2, wherein the information indicating the correlation is created by ray trace from said transmission part to said light-receiving surface, based on decentering of said transmission part from the center of curvature of said lens and at least one of a refractive index and thickness of said measurement substrate, a radius of curvature, a refractive index, and a thickness of said lens, a distance between said transmission part and said light-receiving surface, and a tilt of said light-receiving surface.

5. The apparatus according to claim 1, wherein
   said measurement substrate includes a plurality of transmission parts configured to transmit the light beam having passed through said projection optical system, and
   said calculator arithmetically converts a light intensity distribution, on said light-receiving surface, of the light beam received by said light-receiving surface into a light intensity distribution on the pupil plane of said projection optical system, based on information indicating a correlation between a position coordinate on the pupil of said projection optical system and a position coordinate on said light-receiving surface, which correspond to each of said plurality of transmission parts.

6. The apparatus according to claim 1, further comprising an adjuster configured to adjust an optical characteristic of said exposure apparatus on the basis of a conversion result obtained by said calculator.

7. A method using an apparatus comprises a projection optical system configured to project a pattern of a reticle onto a substrate, a measurement substrate which is inserted on an image plane of the projection optical system and includes a transmission part configured to transmit a light beam having passed through the projection optical system, and a light-receiving unit including a light-receiving surface configured to receive the light beam transmitted through a liquid and the transmission part, comprising:
   arithmetically converting a light intensity distribution, on the light-receiving surface, of the light beam received by the light-receiving surface into a light intensity distribution on a pupil plane of the projection optical system, based on information indicating a correlation between a position coordinate on the light-receiving surface and a position coordinate on the pupil of the projection optical system; and
   adjusting an optical characteristic of the apparatus based on a conversion result obtained in the converting step, and wherein the converting step divides a region of the pupil plane of said projection optical system into a plurality of elements arrayed in a grid pattern, and the converting step calculates a light intensity of one element of the plurality of elements by multiplying a light amount in at least one pixel on said light-receiving surface by a ratio of an area of the region on said light-receiving surface where light having passed through the one element reaches said pixel on said light-receiving surface and a total area of said pixel.

8. The method according to claim 7, further comprising creating the information indicating the correlation based on decentering of the transmission part from the center of curvature of a lens which has a curvature and is inserted between the measurement substrate and the light-receiving unit to be adjacent to the measurement substrate at a distance not more than a wavelength of the light beam, and at least one of a refractive index and thickness of the measurement substrate, a radius of curvature, a refractive index, and a thickness of the lens, a distance between the transmission part and the light-receiving surface, and a tilt of the light-receiving surface.

9. The method according to claim 8, wherein the creating includes:

ray-tracing the light beam which enters the light-receiving surface from the transmission part, based on decentering of the transmission part from the center of curvature of the lens and at least one of the refractive index and thickness of the measurement substrate, the radius of curvature, the refractive index, and the thickness of the lens, the distance between the transmission part and the light-receiving surface, and the tilt of the light-receiving surface;

calculating an intersection between a position coordinate on the light-receiving surface and a position coordinate on the pupil of the projection optical system based on the result obtained in the ray-tracing; and calculating the information indicating the correlation based on the calculated intersection.

* * * * *